(12) United States Patent
Ishizone et al.

(10) Patent No.: US 8,072,712 B2
(45) Date of Patent: Dec. 6, 2011

(54) TUNNELING MAGNETIC SENSING ELEMENT HAVING TWO-LAYERED HARD BIAS LAYER

(75) Inventors: Masahlko Ishizone, Tokyo (JP); Yasuo Hayakawa, Tokyo (JP)

(73) Assignee: TDK Corporation, Tokyo (JP)

( * ) Notice: Subject to any disclaimer, the term of this patent is extended or adjusted under 35 U.S.C. 154(b) by 745 days.

(21) Appl. No.: 12/116,499

(22) Filed: May 7, 2008

(65) Prior Publication Data

US 2008/0278866 A1    Nov. 13, 2008

(30) Foreign Application Priority Data

May 7, 2007  (JP) ................. 2007-122120

(51) Int. Cl.
G11B 5/39    (2006.01)

(52) U.S. Cl. ................................. 360/324.12
(58) Field of Classification Search .............. 360/324.12
See application file for complete search history.

(56) References Cited

U.S. PATENT DOCUMENTS

| | | | |
|---|---|---|---|
| 2003/0048585 A1* | 3/2003 | Gill ........................ | 360/324.12 |
| 2005/0180063 A1* | 8/2005 | Cyrille et al. ............ | 360/324.12 |
| 2005/0180064 A1* | 8/2005 | Cyrille et al. ............ | 360/327.3 |
| 2005/0275975 A1* | 12/2005 | Zhang et al. ............. | 360/324.12 |
| 2006/0132988 A1* | 6/2006 | Zhang et al. ............. | 360/324.12 |
| 2006/0132989 A1* | 6/2006 | Zhang et al. ............. | 360/324.12 |
| 2006/0158793 A1* | 7/2006 | Arasawa et al. ......... | 360/324.12 |

FOREIGN PATENT DOCUMENTS

JP    08-050709    2/1996
JP    08-287419    11/1996

* cited by examiner

*Primary Examiner* — Craig A. Renner
(74) *Attorney, Agent, or Firm* — Brinks Hofer Gilson & Lione

(57) ABSTRACT

At both sides of an element portion, a first hard bias layer having a higher residual magnetization Mr and a second hard bias layer having a higher coercive force Hc are deposited in that order from the bottom with one end of the first hard bias layer being closed close to a free magnetic layer. A film thickness ratio of the first hard bias layer in a whole hard bias layer is from 35% to 75%. This stabilizes magnetization in the free magnetic layer to reduce asymmetry, thus enabling improvement in stability of reproducing characteristics including noise suppression.

10 Claims, 4 Drawing Sheets

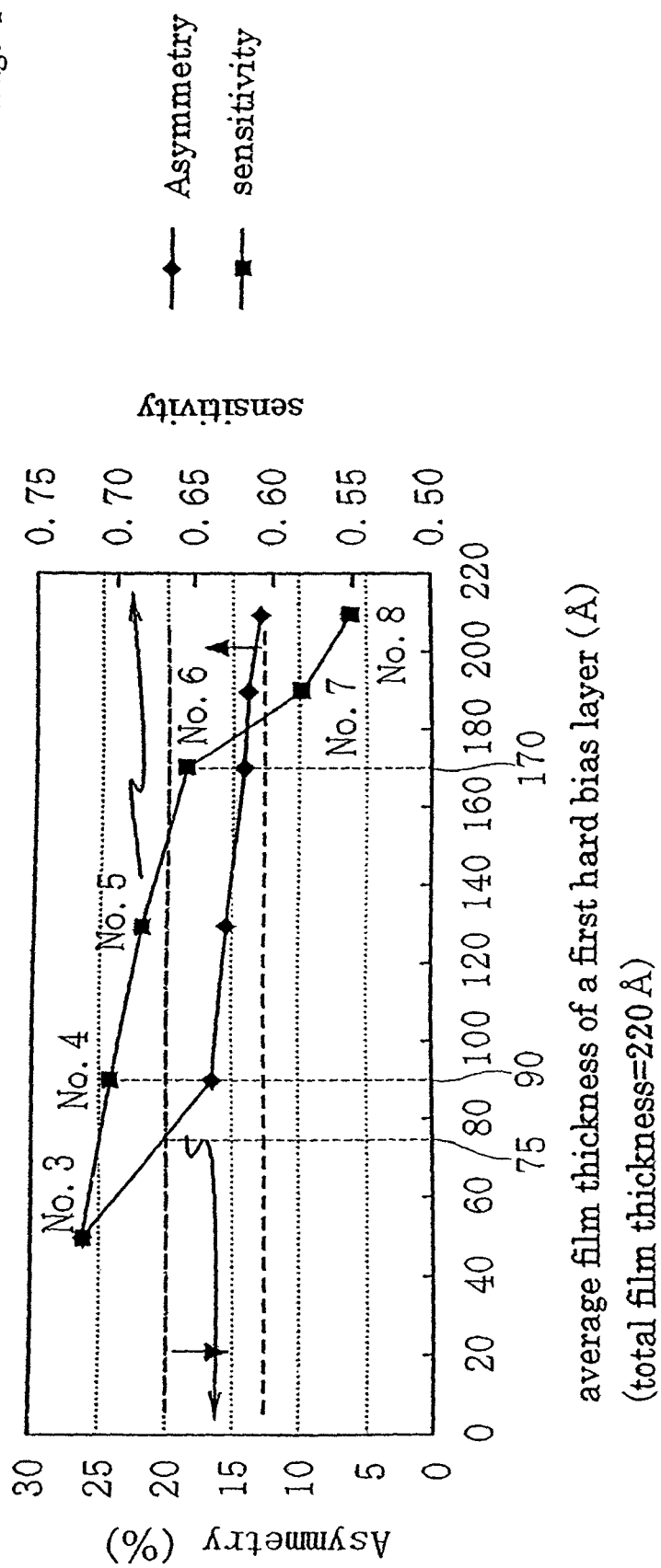

TUNNELING MAGNETIC SENSING ELEMENT HAVING TWO-LAYERED HARD BIAS LAYER

CLAIM OF PRIORITY

This application claims benefit of the Japanese Patent Application No. 2007-122120 filed on May 7, 2007, the entire content of which is hereby incorporated by reference.

BACKGROUND

1. Field of the Invention

Particularly the present invention relates to a magnetic sensing element which reduces asymmetry with improved stability of magnetization in a free magnetic layer, thus enabling improvement in stability of reproducing characteristics including noise suppression.

2. Description of the Related Art

In a tunneling magnetic sensing element, for example, a hard bias layer extends at both sides of an element portion which exhibits a tunneling magnetoresistance effect.

The hard bias layer applies a bias magnetic field to a free magnetic layer being one component of the element portion, thereby improving the stability of magnetization in the free magnetic layer.

The hard bias layer is required to be so stable that the hard bias layer itself will not cause a change in magnetization in response to an external magnetic field and also be capable of applying a large bias magnetic field to the free magnetic layer.

Japanese Unexamined Patent Application Publication Nos. 08-50709 and 08-287419 are examples of the related art.

It is desirable that the hard bias layer is large in both coercive force Hc and Mr×t (Mr is residual magnetization; t is film thickness). The coercive force Hc mainly contributes to the stability of the hard bias layer with respect to the external magnetic field, while the Mr×t mainly contributes to the magnitude of the bias magnetic field with respect to the free magnetic layer.

However it has been difficult to increase both the coercive force Hc and the Mr×t of the hard bias layer. For instance, increasing the coercive force Hc by selecting the material of the hard bias layer resulted in decreasing the Mr×t.

Accordingly, heretofore the stability of magnetization in the free magnetic layer was insufficient and therefore the asymmetry increased, so that the stability of reproducing characteristics could not be sufficiently improved, e.g., resulting in increasing noise.

In the above-identified Patent Documents, the hard bias layer has a layered structure. However, these Patent Documents do not aim at increasing both the coercive force Hc and the Mr×t of the hard bias layer that is to apply a bias magnetic field to the free magnetic layer. Moreover, they do not define essential magnetic properties, concrete film thicknesses and so on of upper and lower hard bias layers.

SUMMARY

The present invention is to solve the problems of the prior art and more particularly has an object to provide a magnetic sensing element which reduces asymmetry with improved stability of magnetization in a free magnetic layer, thus enabling improvement in stability of reproducing characteristics including noise suppression.

According to the present invention, there is provided a magnetic sensing element comprising:

an element portion for exhibiting a magnetoresistance effect, the element portion having at least a pinned magnetic layer, a free magnetic layer, and a nonmagnetic material layer layered in a film thickness direction with the nonmagnetic material layer being disposed between the pinned magnetic layer and the free magnetic layer; and a hard bias layer for applying a bias magnetic field to the free magnetic layer, the hard bias layer extending at both sides of the element portion in a track width direction, wherein the hard bias layer includes a first hard bias layer and a second hard bias layer disposed on the first hard bias layer, and the first hard bias layer has a higher residual magnetization Mr than the second hard bias layer, while the second hard bias layer has a higher coercive force Hc than the first hard bias layer, wherein one end of the first hard bias layer on the side of the element portion is located closer to the free magnetic layer in the track width direction than the second hard bias layer, wherein the first hard bias layer has an average film thickness accounting for 35% to 75% of a total film thickness that is a sum of the average film thickness of the first hard bias layer and an average film thickness of the second hard bias layer.

This increases the bias effect on the free magnetic layer, so that the asymmetry (i.e., asymmetry of reproduced waveform) can be reduced while keeping the magnetic sensitivity of the free magnetic layer at an excellent level, resulting in improving the stability of reproducing characteristics, e.g., suppressing noise.

In the present invention, preferably, the first hard bias layer is composed of CoPt, and the second hard bias layer is composed of CoPtCr. This enables that the first hard bias layer has a higher residual magnetization Mr than the second hard bias layer, while the second hard bias layer has a higher coercive force Hc than the first hard bias layer.

In the present invention, preferably, the first hard bias layer has an average film thickness of 75 Å to 170 Å. This is more effective in reducing the asymmetry while keeping the magnetic sensitivity of the free magnetic layer at an excellent level, resulting in improving the stability of reproducing characteristics, e.g., suppressing noise.

In the magnetic sensing element according to the present invention, asymmetry can be reduced with improved stability of magnetization in a free magnetic layer, thus enabling improvement in stability of reproducing characteristics including noise suppression.

The present invention will be more fully understood from the detailed description given hereinbelow and the accompanying drawings which are given by way of illustration only, and thus are not to be considered as limiting the present invention.

BRIEF DESCRIPTION OF THE DRAWINGS

FIG. 4 is a graph showing a relationship between an average film thickness of a first hard bias layer (CoPt) and asymmetry and magnetic sensitivity of a free magnetic layer for sample Nos. 3 to 8 in which a hard bias layer was formed by depositing CoPt/CoPtCr in that order from the bottom.

DESCRIPTION OF THE PREFERRED EMBODIMENTS

Figure 1:
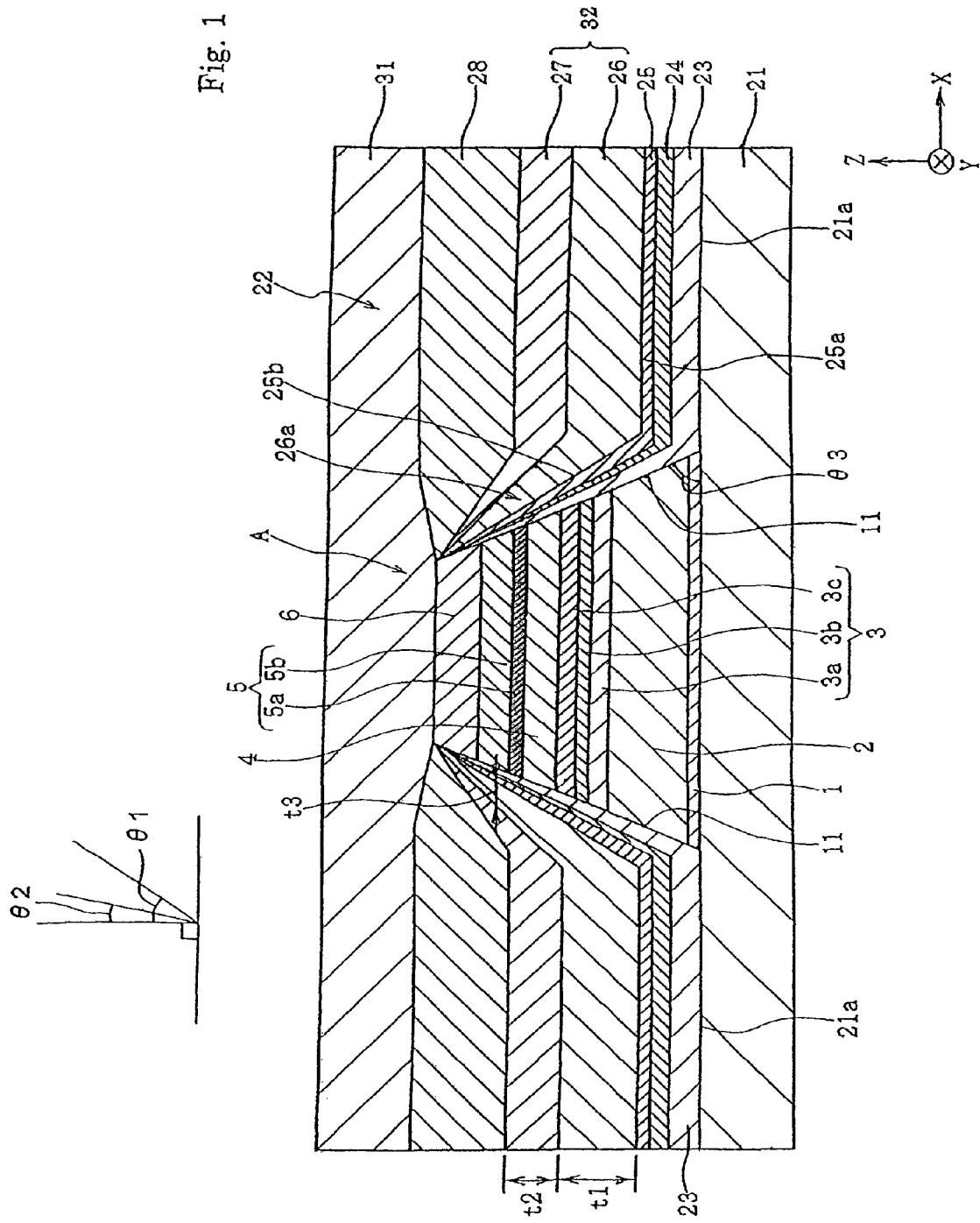
FIG. 1 is a cross-sectional view of a tunneling magnetic sensing element according to one embodiment of the present invention, taken along a plane parallel to a surface facing a recoding medium.

FIG. 1 is a cross-sectional view of a thin-film magnetic head provided with a tunneling magnetic sensing element according to one embodiment of the present invention, taken along a plane parallel to a surface facing a recoding medium.

The tunneling magnetic sensing element is mounted on a trailing end of a floating-type slider provided on a hard disk drive to detect a recorded magnetic field from a hard disk or the like based on the tunneling magnetoresistance effect (TMR effect). In the drawings, the X direction corresponds to the track width direction, the Y direction corresponds to the direction of a leakage magnetic field from a magnetic recording medium (height direction), and the Z direction corresponds to the traveling direction of the magnetic recording medium, such as a hard disk, and the lamination direction of the individual layers in the tunneling magnetic sensing element.

Referring to FIG. 1, a lower shield layer 21, for example, composed of a NiFe alloy, is disposed at the bottom. An element portion A is disposed on the lower shield layer 21. The tunneling magnetic sensing element includes the element portion A and two side portions 22 disposed at both sides of the element portion A in the track width direction (X direction in the figure).

The bottom layer in the element portion A is a seed layer 1. The seed layer 1 is composed of NiFeCr or Cr. When the seed layer 1 is composed of NiFeCr, the seed layer 1 has a face-centered cubic (fcc) structure, and equivalent crystal planes represented as {111} planes are preferentially oriented in the direction parallel to the film surface. When the seed layer 1 is composed of Cr, on the other hand, the seed layer 1 has a body-centered cubic (bcc) structure, and equivalent crystal planes represented as {110} planes are preferentially oriented in the direction parallel to the film surface. It should be noted that beneath the seed layer 1, there may be disposed an underlying layer composed of a nonmagnetic material, such as one or two or more elements selected from the group consisting of Ta, Hf, Nb, Zr, Ti, Mo, and W.

An antiferromagnetic layer 2 disposed on the seed layer 1 is preferably composed of an antiferromagnetic material containing Mn and an element α (wherein α is one or two or more elements selected from the group consisting of Pt, Pd, Ir, Rh, Ru, and Os).

The α-Mn alloys including such platinum-group elements have excellent properties as antiferromagnetic materials, for example, including excellent corrosion resistance, high blocking temperature and large exchange coupling magnetic fields (Hex).

Alternatively, the antiferromagnetic layer 2 may be composed of an antiferromagnetic material containing Mn, the element α, and an element α' (wherein the element α' is one or two or more elements selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and rare-earth elements).

A pinned magnetic layer 3 is disposed on the antiferromagnetic layer 2. The pinned magnetic layer 3 preferably has a synthetic ferromagnetic structure in which a first pinned magnetic sublayer 3a (for example, composed of a CoFe alloy), a nonmagnetic intermediate sublayer 3b (for example, composed of Ru) and a second pinned magnetic sublayer 3c (for example, composed of a CoFe alloy) are disposed in that order from the bottom, because it can enhance the magnetization pinning force of the pinned magnetic layer 3.

An insulating barrier layer 4 is disposed on the pinned magnetic layer 3. The insulating barrier layer 4 is, for example, composed of titanium oxide (Ti—O) or magnesium oxide (Mg—O).

A free magnetic layer 5 is disposed on the insulating barrier layer 4. The free magnetic layer 5 preferably includes a soft magnetic layer 5b, for example, composed of a NiFe alloy and an enhancement layer 5a disposed between the soft magnetic layer 5b and the insulating barrier layer 4 and, for example, composed of a CoFe alloy. This enables improvement in reproducing characteristics including an increase in the rate of change in resistance (ΔR/R).

A protective layer 6, for example, composed of a nonmagnetic metal material such as Ta is disposed on the free magnetic layer 5.

As described above, the element portion A for exhibiting the tunneling magnetoresistance effect (TMR effect) is disposed on the lower shield layer 21. Both side faces of the element portion A in the track width direction (X direction in the figure) are formed as inclined surfaces 11, 11 such that the width in the track width direction gradually decreases upward. The inclined surface 11 extends in a straight line or a curved line on the section shown in FIG. 1. An angle θ3 which the inclined surface 11 makes with an flat surface 21a of the lower shield layer 21 is preferably from 45° to 60°.

At both sides of the element portion A, as shown in FIG. 1, an insulating layer 23 extends from the flat surface (upper surface) 21a of the lower shield layer 21 to the inclines surface 11 of the element portion A.

On the insulating layer 23, as shown in FIG. 1, an underlayer 24, an orientation control layer 25, a first hard bias layer 26 and a second hard bias layer 27 are disposed in that order from the bottom. A protective layer 28 is disposed on the second hard bias layer 27.

The side portion 22 has a multilayered structure including all the layers from the insulating layer 23 to the protective layer 28

The underlayer 24 is, for example, composed of Ta. The orientation control layer 25 is, for example, composed of CrTi or Cr. The protective layer 28 is not limited to any particular material as long as it is not magnetic, but in a case where the insulating layer 23 is not disposed, the protective layer 28 is preferably an insulating layer. The protective layer 28 may be an insulating layer along with the insulating layer 23. In the embodiment shown in FIG. 1, the protective layer 28 is, for example, composed of Ta.

As shown in FIG. 1, both the underlayer 24 and the orientation control layer 25 extend up to the top of the inclined surface 11 of the element portion A.

The first hard bias layer 26 extends from a flat surface 25a to an inclined surface 25b of the orientation control layer 25. Thus one end 26a of the first hard bias layer 26, which lies on the inclined surface 25b and faces toward the element portion A, is opposed to the free magnetic layer 5 in the track width direction (X direction in the figure) and closer in distance to the free magnetic layer 5 than the second hard bias layer 27.

As shown in FIG. 1, an upper shield layer 31 is disposed over the element portion A and both the side portions 22. The upper shield layer 31 is, for example, composed of a NiFe alloy.

In the embodiment shown in FIG. 1, the lower shield layer 21 and the upper shield layer 31 serve as electrode layers for the element portion A, so that a current flows in a direction perpendicular to the film surfaces of the individual layers of the element portion A (in a direction parallel to the Z direction in the figure).

The free magnetic layer 5 is magnetized in a direction parallel to the track width direction (X direction in the figure) under the influence of a bias magnetic field from a hard bias layer 32 that has a layered structure constituted of the first hard bias layer 26 and the second hard bias layer 27. On the other hand, the pinned magnetic layer 3 is magnetized in a direction parallel to the height direction (Y direction in the figure). While the magnetization of the pinned magnetic layer 3 is pinned (does not vary in response to an external magnetic field), the magnetization of the free magnetic layer 5 varies in response to an external magnetic field.

When the magnetization of the free magnetic layer 5 changes in response to an external magnetic field and when the magnetization directions of the second pinned magnetic sublayer 3c and the free magnetic layer 5 are antiparallel to each other, a tunnel current does not easily flow through the insulating barrier layer 4 provided between the second pinned magnetic sublayer 3c and the free magnetic layer 5, and the resistance is a maximum. On the other hand, when the magnetization directions of the second pinned magnetic sublayer 3c and the free magnetic layer 5 are parallel to each other, the tunnel current flows most easily, and the resistance is a minimum.

By use of the principle described above, a change in electrical resistance caused by a change in the magnetization of the free magnetic layer 5 under an influence of an external magnetic field is captured as a change in voltage to detect a leakage magnetic field from a recording medium.

Next will be described features of the tunneling magnetic sensing element of the present embodiment. As shown in FIG. 1, the hard bias layer 32 has a layered structure constituted of the first hard bias layer 26 and the second hard bias layer 27 disposed on the first hard bias layer 26.

The first hard bias layer 26 has a higher residual magnetization Mr than the second hard bias layer 27. On the other hand, the second hard bias layer 27 has a higher coercive force Hc than the first hard bias layer 26.

As shown in FIG. 1, the end 26a of the first hard bias layer 26 on the side of the element portion A is located closer to the free magnetic layer 5 than the second hard bias layer 27.

In the present embodiment, moreover, the first hard bias layer 26 has an average film thickness t1 accounting for 35% to 75% of a total film thickness (t1+t2) that is a sum of the average film thickness t1 of the first hard bias layer 26 and an average film thickness t2 of the second hard bias layer 27. The average film thickness t1 of the first hard bias layer 26 and the average film thickness t2 of the second hard bias layer 27 both refer to a film thickness at a position over the flat surface 21a of the lower shield layer 21 and away from the inclined surface 11 of the element portion A in the track width direction (film thickness of a flat portion disposed over the flat surface 21a of the lower shield layer 21 and outside a bend from which the hard bias layer extends upward along the inclined surface 11).

This increases Mr×t1 of the first hard bias layer 26, which is a lower layer portion of the hard bias layer 32, so that the hard bias layer 32 can apply a larger bias magnetic field to the free magnetic layer 5 than in a case where the hard bias layer 32 is constituted only of the second hard bias layer 27. The Mr×t1 of the first hard bias layer 26 is preferably larger than Mr×t2 of the second hard bias layer 27. In the configuration of FIG. 1, moreover, the end 26a of the first hard bias layer 26 is located closer to the free magnetic layer 5 than the second hard bias layer 27. Referring to FIG. 1, a film thickness t3 of the first hard bias layer 26 in the track width direction at a level corresponding to the center of the film thickness of the free magnetic layer 5 is preferably in the range of 30 Å to 100 Å. This is effective in applying a large bias magnetic field to the free magnetic layer 5.

Moreover, since the second hard bias layer 27 has a higher coercive force Hc than the first hard bias layer 26, the stability of magnetization in the hard bias layer 32 itself can be improved more than in a case where the hard bias layer 32 is constituted only of the first hard bias layer 26.

According to the present embodiment, in short, both the Mr×t and the coercive force Hc of the hard bias layer 32 can be effectively increased. Thus the asymmetry (i.e., asymmetry of reproduced waveform) can be reduced while keeping the magnetic sensitivity of the free magnetic layer 5 at an excellent level, resulting in improving the stability of reproducing characteristics, e.g., suppressing noise.

In the present embodiment, the film thickness ratio of the first hard bias layer 26 in the flat portion of the hard bias layer 32 is preferably 40% or more.

The first hard bias layer 26 is preferably composed of CoPt. This makes the residual magnetization Mr of the first hard bias layer 26 appropriately higher than the residual magnetization Mr of the second hard bias layer 27. Also the second hard bias layer 27 is preferably composed of CoPtCr. This makes the coercive force Hc of the second hard bias layer 27 appropriately higher than the coercive force Hc of the first hard bias layer 26.

In the present embodiment, moreover, the average film thickness t1 of the first hard bias layer 26 is preferably from 75 Å to 170 Å. More preferably, it is 90 Å or more. This is more effective in reducing the asymmetry while keeping the magnetic sensitivity of the free magnetic layer 5 at an excellent level, resulting in improving the stability of reproducing characteristics, e.g., suppressing noise.

At the time of formation of the hard bias layer 32 of the tunneling magnetoresistive element shown in FIG. 1, the deposition angle (tilt angle from the vertical direction (Z direction in the figure) to the flat surface 21a of the lower shield layer 21) θ1 of the first hard bias layer 26 is preferably larger than the deposition angle θ2 of the second hard bias layer 27. More specifically, the deposition angle θ1 of the first hard bias layer 26 is set in the range of 40° to 60°, and the deposition angle θ2 of the second hard bias layer 27 is set in the range of 0° to 20°.

This enables the end 26a of the first hard bias layer 26 to extend over the inclined surface 25b of the orientation control layer 25 more readily, so that the end 26a of the first hard bias layer 26 can be located close to the free magnetic layer 5 in the track width direction (X direction in the figure).

The configuration of the hard bias layer 32 shown in FIG. 1 is not limited to the tunneling magnetoresistive element shown in FIG. 1, but is also applicable to a CPP-GMR element, in which the insulating barrier layer 4 is composed of a nonmagnetic conductive layer such as Cu, and a CIP-GMR element, in which the insulating barrier layer 4 is composed of a nonmagnetic conductive layer such as Cu, the insulating layer 23 is not disposed, an electrode is disposed on the hard bias layer 32, and insulating gap layers composed of $Al_2O_3$ or the like are disposed between the lower shield layer 21 and the element portion A and between the upper shield layer 31 and the element portion A.

In addition to use as a magnetic head in a hard disk drive, the magnetic sensing element according to the present embodiment can also be used as a MRAM (magnetoresistive random access memory) or a magnetic sensor.

While the present invention has been particularly shown and described with reference to embodiments thereof, it will be understood by those skilled in the art that various changes in form and detail may be made therein without departing from the spirit, scope and teaching of the invention.

EXAMPLE 1

The following film configuration was obtained.

Deposition was performed in the order of Ta (15)/Cr (50)/hard bias layer (200)/Ta (50) from the bottom. Each of the values in parentheses indicates an average film thickness in terms of Å.

In the experiment, the coercive force Hc and Mr×t were obtained using $Co_{78\,at\,\%}Pt_{22\,at\,\%}$ or $Co_{74\,at\,\%}Pt_{22\,at\,\%}Cr_{4\,at\,\%}$ as a hard bias layer. The experimental results are shown in Table 1 below.

TABLE 1

| Hard | Hc (Oe) | Mr·t (G × m) |
|---|---|---|
| CoPt (200) | 2090 | 220 |
| CoPtCr₄ (200) | 2340 | 200 |

As shown in Table 1, CoPt had higher Mr×t than CoPtCr. Since CoPt and CoPtCr had the same film thickness t (200 Å), it is seen that CoPt had higher residual magnetization Mr than CoPtCr.

As shown in Table 1, moreover, CoPtCr had higher coercive force Hc than CoPt.

EXAMPLE 2

Then a tunneling magnetoresistive element shown in FIG. 1 was prepared. The side portions 22 of the tunneling magnetic sensing element were formed by depositing Ta (15)/Cr (50)/first hard bias layer; $Co_{78\,at\,\%}Pt_{22\,at\,\%}$ (t1)/second hard bias layer; $Co_{74\,at\,\%}Pt_{22\,at\,\%}Cr_{4\,at\,\%}$ (t2)/Ta (50) in that order from the bottom. Each of the values in parentheses indicates an average film thickness in terms of Å.

In the experiment, the total film thickness being the sum of the average film thickness t1 of the first hard bias layer and the average film thickness t2 of the second hard bias layer was set at 220 Å, and the relationship between the magnetic sensitivity of the free magnetic layer and the variance σ in asymmetry was studied by varying the average film thickness of the first hard bias layer in the range of 50 Å to 210 Å. Here the deposition angle (tilt angle from the vertical direction to the substrate surface) at the time of formation of the first hard bias layer was set at 55°, while the deposition angle at the time of formation of the second hard bias layer was set at 5°.

The magnetic sensitivity of the free magnetic layer can be obtained by Δr/ΔR, where ΔR represents a change in resistance of the tunneling magnetic sensing element when a very large external magnetic field (3 to 4 kOe) was applied in the height direction (Y direction in the figure) being the direction of magnetization of the pinned magnetic layer 3 shown in FIG. 1, while Δr represents a change in resistance of the tunneling magnetic sensing element when a small external magnetic field (600 Oe) was applied in the height direction.

The fact that the free magnetic layer has excellent magnetic sensitivity means that the free magnetic layer can readily cause a change in magnetization according to a change in the external magnetic field, and therefore improvement in the rate of change in resistance or the like requires the free magnetic layer to have excellent magnetic sensitivity. However if the magnetic sensitivity is excessively enhanced, it may lead to destabilization of reproducing characteristics, e.g., causing noise. Hence the magnetic sensitivity of the free magnetic layer is preferably set within the same range as before.

Figure 2:
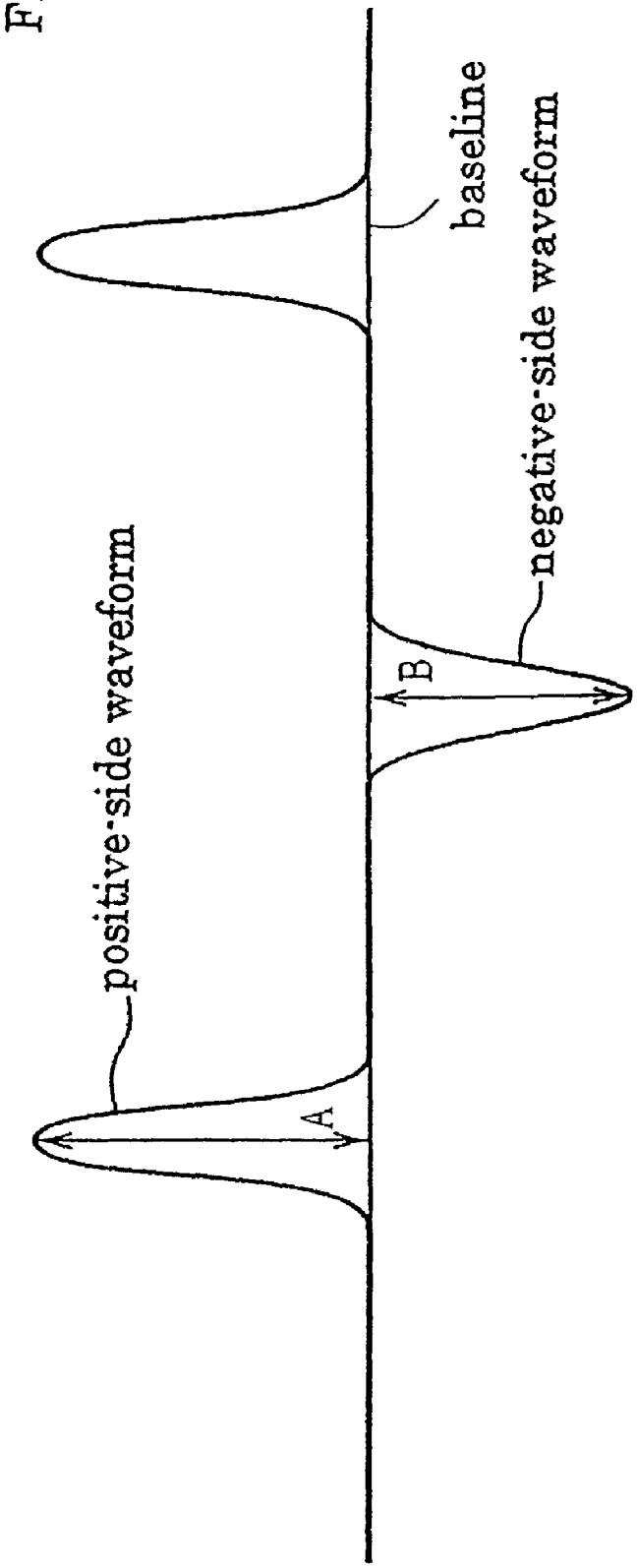
FIG. 2 is a schematic diagram about how to obtain asymmetry.

On the other hand, the asymmetry can be obtained by the following equation:

$$\text{Asymmetry} = \{(A-B)/(A+B)\} \times 100(\%),$$

where A represents a height from the baseline to the top of the positive-side waveform, while B represents a height from the baseline to the bottom of the negative-side waveform as shown in FIG. 2.

The variance σ in asymmetry is expressed by a value of standard deviation calculated from individual asymmetry values of a large number of elements within a single wafer that was formed with the average film thickness of the first hard bias layer being set to a given value. The magnetic sensitivity of the free magnetic layer is expressed by an average magnetic sensitivity of the many elements used for calculating the variance σ.

COMPARATIVE EXAMPLE 1

In the configuration of Example 2 described above, the deposition order of the first hard bias layer and the second hard bias layer was inverted.

In the experiment, the total film thickness being the sum of the average film thickness t1 of the first hard bias layer and the average film thickness t2 of the second hard bias layer was set at 220 Å, and the relationship between the magnetic sensitivity of the free magnetic layer and the variance σ in asymmetry was studied by varying the average film thickness of the first hard bias layer in the range of 50 Å to 170 Å. Here the deposition angle at the time of formation of the second hard bias layer was set at 55°, while the deposition angle at the time of formation of the first hard bias layer was set at 5°.

CONVENTIONAL EXAMPLE 1

In the configuration of Example 2 described above, the hard bias layer was composed of $Co_{78\,at\,\%}Pt_{22\,at\,\%}$ into a single layer structure.

In the experiment, the relationship between the magnetic sensitivity of the free magnetic layer and the variance σ in asymmetry was studied by varying the average film thickness of the hard bias layer in the range of 180 Å to 220 Å. Here the deposition angle at the time of formation of the hard bias layer was set at 55°.

CONVENTIONAL EXAMPLE 2

In the configuration of Example 2 described above, the hard bias layer was composed of $Co_{74\,at\,\%}Pt_{22\,at\,\%}Cr_{4\,at\,\%}$ into a single layer structure.

In the experiment, the relationship between the magnetic sensitivity of the free magnetic layer and the variance σ in asymmetry was studied by varying the average film thickness of the hard bias layer in the range of 180 Å to 220 Å. Here the deposition angle at the time of formation of the hard bias layer was set at 55°.

Figure 3:
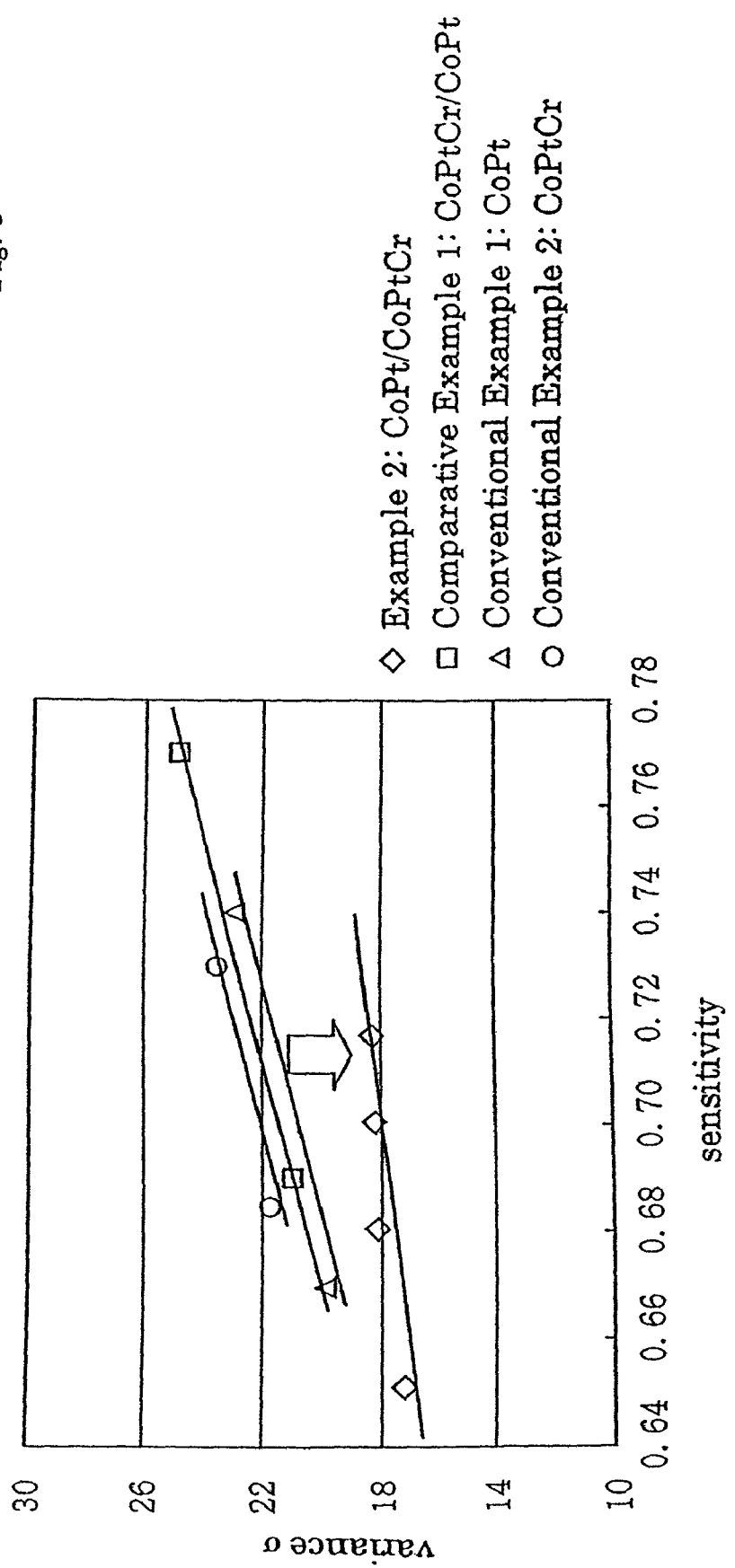
FIG. 3 is a graph showing a relationship between magnetic sensitivity of a free magnetic layer and variance σ in asymmetry for Example 2 (a hard bias layer was formed by depositing CoPt/CoPtCr in that order from the bottom), Comparative Example 1 (a hard bias layer was formed by depositing CoPtCr/CoPt in that order from the bottom), Conventional Example 1 (a hard bias layer was formed by a single layer of CoPt), and Conventional Example 2 (a hard bias layer was formed by a single layer of CoPtCr)

For the individual samples of Example 2, Comparative Example 1 and Conventional Examples 1 and 2, the relationship between the magnetic sensitivity of the free magnetic layer and the variance σ in asymmetry is shown in FIG. 3.

As shown in FIG. 3, the free magnetic layers of Example 2, Comparative Example 1 and Conventional Examples 1 and 2 had almost the same magnetic sensitivities, but the variance σ of Example 2 was smaller than those of Comparative Example 1 and Conventional Examples 1 and 2, and therefore it is seen that the stability of reproducing characteristics was improved.

The sample of Comparative Example 1 was prepared by inverting the order of the hard bias layers in the sample of Example 2, but the configuration of Comparative Example 1 did not cause any significant difference in variance σ as compared with the conventional ones, thus exhibiting no improvement.

Accordingly it is seen that the lower part of the hard bias layer should be composed of CoPt having a high residual magnetization Mr and CoPtCr having a high coercive force Hc should be deposited thereon.

EXAMPLE 3

Next a tunneling magnetoresistive element shown in FIG. 1 was prepared. The side portions 22 of the tunneling magnetic sensing element were formed by depositing Ta (15)/Cr (50)/first hard bias layer; $Co_{78\ at\%}Pt_{22\ at\%}$ (t1)/second hard bias layer; $Co_{74\ at\%}Pt_{22\ at\%}Cr_{4\ at\%}$ (t2)/Ta (50) in that order from the bottom. Each of the values in parentheses indicates an average film thickness in terms of Å.

In the experiment, the first hard bias layer and the second hard bias layer were prepared with the film thickness and deposition angle (tilt angle from the vertical direction to the substrate surface) being set as shown in Table 2 below.

Then the individual samples shown in Table 2 were measured for the magnetic sensitivity of the free magnetic layer, the asymmetry, and the variance σ in asymmetry.

TABLE 2

| | $1^{st}$ hard bias (CoPt) | | $2^{nd}$ hard bias (CoPtCr) | | Sensitivity | Asym. | Variance σ |
|---|---|---|---|---|---|---|---|
| No. | Thickness(Å) | Angle(°) | Thickness(Å) | Angle(°) | dr/DR | (%) | (%) |
| 1 | 50 | 5 | 170 | 55 | 0.70 | 16.9 | 25.7 |
| 2 | 170 | 5 | 50 | 55 | 0.76 | 32.4 | 28.6 |
| 3 | 50 | 55 | 170 | 5 | 0.72 | 26.1 | 18.2 |
| 4 | 90 | 55 | 130 | 5 | 0.70 | 16.2 | 23.3 |
| 5 | 130 | 55 | 90 | 5 | 0.68 | 15.2 | 18.1 |
| 6 | 170 | 55 | 50 | 5 | 0.65 | 13.9 | 17.2 |
| 7 | 190 | 55 | 30 | 5 | 0.58 | 13.6 | 18.1 |
| 8 | 210 | 55 | 10 | 5 | 0.55 | 12.9 | 17.2 |

The film thicknesses shown in Table 2 were average film thicknesses measured at the flat portions of the first hard bias layer 26 and the second hard bias layer 27 shown in FIG. 1.

In the sample Nos. 1 and 2, as shown in Table 2, the deposition angle θ1 of the first hard bias layer was set at 5° and the deposition angle θ2 of the second hard bias layer was set at 55°, but in these cases, it was impossible to reduce both the asymmetry and the variance σ. This seems to be because the first hard bias layer was not disposed sufficiently close to the free magnetic layer in the track width direction, so that the magnitude of the bias magnetic field to be applied to the free magnetic layer decreased to destabilize the magnetization state of the free magnetic layer.

In any one of the sample Nos. 3 to 8, on the other hand, the deposition angle θ1 of the first hard bias layer was set at 55° and the deposition angle θ2 of the second hard bias layer was set at 5°, so that one end of the first hard bias layer was located close to the free magnetic layer in the track width direction, as shown in FIG. 1.

For the sample Nos. 3 to 8, FIG. 4 provides a summary of the relationships between the average film thickness of the first hard bias layer and the asymmetry and the magnetic sensitivity of the free magnetic layer.

As shown in FIG. 4, it is seen that not only the asymmetry but also the magnetic sensitivity of the free magnetic layer decreased with increasing the film thickness ratio of the first hard bias layer in the total hard bias layer.

It is preferred that the asymmetry is 20% or less and the magnetic sensitivity of the free magnetic layer is 0.6 or more.

The film thickness range of the first hard bias layer satisfying the above properties was from 75 Å to 170 Å, wherein the film thickness ratio of the first hard bias layer in the total film thickness of the hard bias layer was from about 34% to about 77%. Based on these experimental results, the film thickness ratio of the first hard bias layer was set within the range of 35% to 75%.

The asymmetry could be reduced more effectively by setting the film thickness range of the first hard bias layer at 90 Å or less. The preferred film thickness ratio of the first hard bias layer in the total film thickness of the hard bias layer was set at 40% or more.

The invention claimed is:

1. A magnetic sensing element comprising:
an element portion for exhibiting a magnetoresistance effect, said element portion having at least a pinned magnetic layer, a free magnetic layer, and a nonmagnetic material layer layered in a film thickness direction with said nonmagnetic material layer being disposed between said pinned magnetic layer and said free magnetic layer; and a hard bias layer for applying a bias magnetic field to said free magnetic layer, said hard bias layer extending at both sides of said element portion in a track width direction, wherein said hard bias layer includes a first hard bias layer and a second hard bias layer disposed directly and completely on said first hard bias layer, and said first hard bias layer has a higher residual magnetization Mr than said second hard bias layer, while said second hard bias layer has a higher coercive force Hc than said first hard bias layer, wherein one end of said first hard bias layer on the side of said element portion is located closer to both sides of said free magnetic layer in the track width direction than said second hard bias layer, wherein said first hard bias layer has an average film thickness t1 accounting for 35% to 75% of a total film thickness that is a sum of said average film thickness t1 of said first hard bias layer and an average film thickness t2 of said second hard bias layer, wherein a side portion is disposed on one side of the element portion, the side portion having a multilayered structure comprising: an insulating layer, an underlayer, an orientation control layer, said first hard bias layer, and said second hard bias layer from bottom to top; and wherein a film thickness t3 of said first hard bias layer in the track width direction at a level corresponding to the center of the film thickness of the free magnetic layer is in the range of 30 Å to 100 Å.

2. The magnetic sensing element according to claim 1, wherein said first hard bias layer is composed of CoPt, and said second hard bias layer is composed of CoPtCr.

3. The magnetic sensing element according to claim 2, wherein said average film thickness t1 is 75 Å to 170 Å.

4. The magnetic sensing element according to claim 1, wherein said average film thickness t1 is 75 Å to 170 Å.

5. The magnetic sensing element according to claim 4, wherein said average film thickness t1 is 90 Å to 170 Å.

6. A magnetic sensing element comprising:

an element portion for exhibiting a magnetoresistance effect, said element portion having at least a pinned magnetic layer, a free magnetic layer, and a nonmagnetic material layer layered in a film thickness direction with said nonmagnetic material layer being disposed between said pinned magnetic layer and said free magnetic layer; and a hard bias layer for applying a bias magnetic field to said free magnetic layer, said hard bias layer extending at both sides of said element portion in a track width direction, wherein said hard bias layer includes a first hard bias layer and a second hard bias layer disposed directly and completely on said first hard bias layer, and said first hard bias layer has a higher residual magnetization Mr than said second hard bias layer, while said second hard bias layer has a higher coercive force Hc than said first hard bias layer, wherein one end of said first hard bias layer on the side of said element portion is located closer to both sides of said free magnetic layer in the track width direction than said second hard bias layer, wherein said first hard bias layer has an average film thickness t1 accounting for 35% to 75% of a total film thickness that is a sum of said average film thickness t1 of said first hard bias layer and an average film thickness t2 of said second hard bias layer, wherein a side portion is disposed on one side of the element portion, the side portion having a multilayered structure comprising: an insulating layer, an underlayer, an orientation control layer, said first hard bias layer, and said second hard bias layer from bottom to top; and wherein Mr×t1 of said first hard bias layer is larger than Mr×t2 of said second hard bias layer.

7. The magnetic sensing element according to claim 6, wherein said first hard bias layer is composed of CoPt, and said second hard bias layer is composed of CoPtCr.

8. The magnetic sensing element according to claim 7, wherein said average film thickness t1 is 75 Å to 170 Å.

9. The magnetic sensing element according to claim 6, wherein said average film thickness t1 is 75 Å to 170 Å.

10. The magnetic sensing element according to claim 9, wherein said average film thickness t1 is 90 Å to 170 Å.

* * * * *